United States Patent
Aoki

(10) Patent No.: US 10,458,606 B2
(45) Date of Patent: Oct. 29, 2019

(54) ORGANIC EL DEVICE

(71) Applicant: NEC LIGHTING, LTD., Minato-ku, Tokyo (JP)

(72) Inventor: Yasushi Aoki, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 16/099,222

(22) PCT Filed: Feb. 28, 2017

(86) PCT No.: PCT/JP2017/007763
§ 371 (c)(1),
(2) Date: Nov. 6, 2018

(87) PCT Pub. No.: WO2017/195437
PCT Pub. Date: Nov. 16, 2017

(65) Prior Publication Data
US 2019/0154213 A1    May 23, 2019

(30) Foreign Application Priority Data

May 12, 2016 (JP) ................................. 2016-096433

(51) Int. Cl.
*F21K 9/64* (2016.01)
*F21S 2/00* (2016.01)
(Continued)

(52) U.S. Cl.
CPC ................. *F21K 9/64* (2016.08); *F21K 9/68* (2016.08); *F21S 2/00* (2013.01); *F21S 10/02* (2013.01);
(Continued)

(58) Field of Classification Search
CPC ......... F21K 9/64; F21K 9/68; H01L 51/0096; H01L 51/50; H01L 51/5246; H05B 33/02; H05B 33/04; H05B 33/12
See application file for complete search history.

(56) References Cited

U.S. PATENT DOCUMENTS 8,922,113 B2 * 12/2014 Forrest .................. H05B 33/22
    313/504
2004/0135160 A1 * 7/2004 Cok ...................... C23C 14/042
    257/88

(Continued)

FOREIGN PATENT DOCUMENTS

JP    H02-44392 A    2/1990
JP    2002-100229 A    4/2002
(Continued)

OTHER PUBLICATIONS

International Search Report for PCT Application No. PCT/JP2017/007763, dated May 30, 2017.

*Primary Examiner* — Anne M Hines
(74) *Attorney, Agent, or Firm* — Sughrue Mion, PLLC

(57) ABSTRACT

An organic EL device includes an organic EL panel, an ellipsoidal reflector, a phosphor, and a laser. The organic EL panel includes a substrate and at least one organic EL element, and the substrate includes at least one light incident portion on which light is incident from the outside. The ellipsoidal reflector is disposed outside the organic EL panel in such a manner that the phosphor is disposed at a first focal point of the reflector and the light incident portion of the substrate is positioned at a second focal point of the reflector. The laser is disposed outside the organic EL panel in such a manner that the phosphor can be irradiated with a laser beam. Light emitted from the phosphor enters the substrate from the light incident portion. The light emitted from the (Continued)

phosphor that has entered the substrate diffuses in the in-plane direction of the substrate.

8 Claims, 3 Drawing Sheets

(51) Int. Cl.
| | |
|---|---|
| *F21S 10/02* | (2006.01) |
| *H01L 51/50* | (2006.01) |
| *H05B 33/02* | (2006.01) |
| *H05B 33/04* | (2006.01) |
| *H05B 33/12* | (2006.01) |
| *H05B 33/24* | (2006.01) |
| *F21K 9/68* | (2016.01) |
| *H01L 51/00* | (2006.01) |
| *H01L 51/52* | (2006.01) |
| *F21Y 115/15* | (2016.01) |

(52) U.S. Cl.
CPC .......... *H01L 51/0096* (2013.01); *H01L 51/50* (2013.01); *H01L 51/5246* (2013.01); *H05B 33/02* (2013.01); *H05B 33/04* (2013.01); *H05B 33/12* (2013.01); *H05B 33/24* (2013.01); *F21Y 2115/15* (2016.08); *H01L 2251/5315* (2013.01)

(56) References Cited

U.S. PATENT DOCUMENTS

| | | | |
|---|---|---|---|
| 2005/0169012 | A1 | 8/2005 | Takeuchi |
| 2014/0361280 | A1* | 12/2014 | Kuribe ................ H01L 27/3204 257/40 |
| 2018/0151844 | A1 | 5/2018 | Aoki |

FOREIGN PATENT DOCUMENTS

| | | | |
|---|---|---|---|
| JP | 2003-092002 | A | 3/2003 |
| JP | 2004-354495 | A | 12/2004 |
| JP | 2005-158370 | A | 6/2005 |
| JP | 2010-199027 | A | 9/2010 |
| JP | 2014-017097 | A | 1/2014 |
| JP | 2015-200833 | A | 11/2015 |
| WO | 2016/190073 | A1 | 12/2016 |

* cited by examiner

ORGANIC EL DEVICE

This application is a National Stage Entry of PCT/JP2017/007763 filed on Feb. 28, 2017, which claims priority from Japanese Patent Application 2016-096433 filed on May 12, 2016, the contents of all of which are incorporated herein by reference, in their entirety.

TECHNICAL FIELD

The present invention relates to an organic EL device.

BACKGROUND ART

An organic electro-luminescence (EL) panel is a self-emitting panel provided with an organic EL element (organic EL layer), and can be used as a lighting device, a light source, or a display device, for example. The emission color of the organic EL panel is determined by the material of the organic EL layer (light emission layer). Thus, when the organic EL panel is in practical use, the emission color is fixed already. On this account, it is generally impossible for a user to adjust the emission color (to perform color tuning) of the organic EL panel.

Under these circumstances, there has been proposed an organic EL panel configured so that organic EL layers for red, green, and blue (RGB) are formed separately, and color adjustment is achieved by adjusting the balance among the emission intensities of RGB (Patent Literature 1).

CITATION LIST

Patent Literature

Patent Literature 1: JP H2(1990)-44392 A

SUMMARY OF INVENTION

Technical Problem

However, in the organic EL panel with the above-described RGB separation structure, it is necessary to provide the RGB light emission layers separately. The aperture ratio is thus restricted, so that it is difficult to increase the amount of luminous flux emitted from the light emission surface of the organic EL panel. One possible method for increasing the amount of luminous flux is to increase the driving current. This, however, shortens the life of the organic EL panel.

With the foregoing in mind, it is an object of the present invention to provide a novel organic EL device including an organic EL panel adapted to be color tunable by a user, for example.

Solution to Problem

In order to achieve the above object, the present invention provides an organic EL device including an organic EL panel, an ellipsoidal reflector, a phosphor, and a laser. The organic EL panel includes a substrate and at least one organic EL element, and the substrate includes at least one light incident portion on which light is incident from the outside. The ellipsoidal reflector is disposed outside the organic EL panel in such a manner that the phosphor is disposed at a first focal point of the ellipsoidal reflector and the light incident portion of the substrate is positioned at a second focal point of the ellipsoidal reflector. The laser is disposed outside the organic EL panel in such a manner that the phosphor can be irradiated with a laser beam. Light emitted from the phosphor enters the substrate from the light incident portion. The light emitted from the phosphor that has entered the substrate diffuses in an in-plane direction of the substrate.

Advantageous Effects of Invention

The present invention can provide a novel organic EL device including an organic EL panel adapted to be color tunable by a user, for example.

DESCRIPTION OF EXAMPLE EMBODIMENTS

Figure 1A:
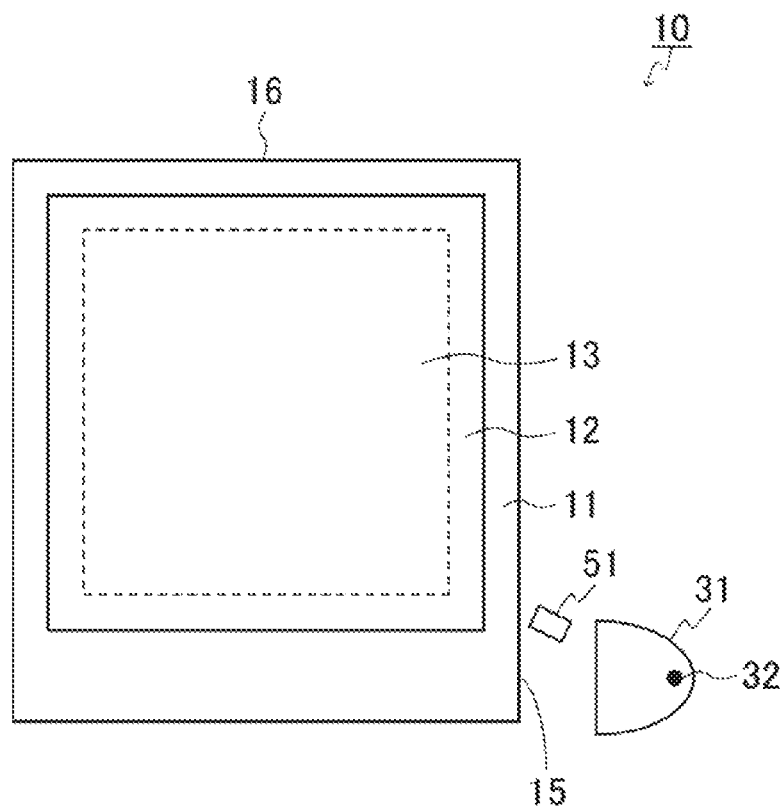
FIG. 1A is a plan view showing an example of the configuration of an organic EL device according to a first example embodiment.

The organic EL device of the present invention will be described specifically below with reference to the accompanying drawings. It is to be noted, however, that the present invention is by no means limited by the following description. In FIGS. 1A to 4 to be described below, the same components are given the same reference numerals, and duplicate explanations thereof may be omitted. Also, in the drawings, the structure of each component may be shown in an simplified form as appropriate for the sake of convenience in illustration, and also, each component may be shown schematically with a dimension ratio and the like that are different from the actual dimension ratio and the like.

First Example Embodiment

Figure 1B:
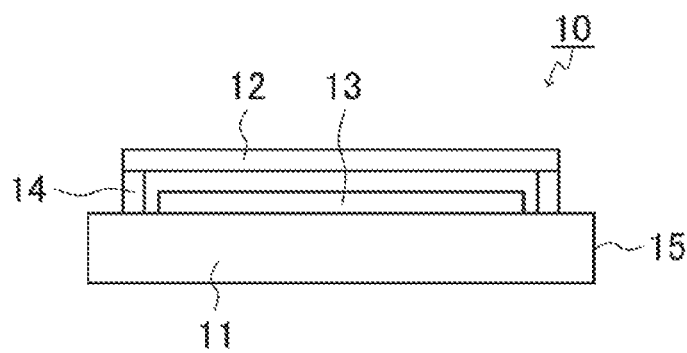
FIG. 1B is a side view of an organic EL panel included in the organic EL device shown in FIG. 1A, as viewed from a lateral side of the organic EL panel.

The present example embodiment is directed to an example of an organic EL device configured so that a substrate has one light incident portion. FIGS. 1A and 1B show an organic EL device of the present example embodiment. FIG. 1A is a plan view showing an example of the configuration of the organic EL device of the present example embodiment. FIG. 1B is a side view of an organic EL panel included in the organic EL device shown in FIG. 1A, as viewed from a lateral side of the organic EL panel. As shown in FIGS. 1A and 1B, the organic EL device 10 of the present example embodiment includes an organic EL panel 16, an ellipsoidal reflector 31, a phosphor 32, and a laser 51. The organic EL panel 16 includes a substrate 11 and an organic EL element 13. The substrate 11 includes at least one light incident portion 15 on which light is incident from the outside. The ellipsoidal reflector 31 is disposed outside the organic EL panel 16 in such a manner that the phosphor 32 is disposed at a first focal point of the ellipsoidal reflector and the light incident portion 15 of the substrate 11 is positioned at a second focal point of the ellipsoidal reflector. The laser 51 is disposed outside the organic EL panel 16 in such a manner that the phosphor 32 can be irradiated with a laser beam 52 (see FIG. 3). Light emitted from the phosphor 32 enters the substrate 11 from the light incident portion 15, and the light emitted from the phosphor 32 that has entered the substrate 11 diffuses in the in-plane direction of the substrate 11. The organic EL device 10 of the present example embodiment includes one light incident portion 15. The details of the light incident portion 15 will be described below. While the organic EL panel 16 shown in FIGS. 1A and 1B is substantially rectangular, the shape of the organic EL panel is not limited thereto. For example, the shape of the organic EL panel may be a substantially polygonal shape other than the substantially rectangular shape, such as a substantially parallelogram shape (including a substantially square shape and a substantially rhombic shape) other than the substantially rectangular shape, a substantially trapezoidal shape, a substantially pentagonal shape, or a substantially hexagonal shape.

In the organic EL device 10, it is only necessary that the organic EL panel 16 includes at least one substrate 11 and the organic EL element 13, and other configurations are not particularly limited. For example, as shown in FIGS. 1A and 1B, the organic EL panel 16 may include the first substrate 11, a second substrate 12, a sealing layer 14, and the organic EL element 13. In the example shown in FIGS. 1A and 1B, one surface of the first substrate 11 is a mounting surface on which at least one organic EL element 13 is disposed. The first substrate 11 and the second substrate 12 are laminated in such a manner that the mounting surface of the first substrate 11 and one surface of the second substrate 12 face each other with the sealing layer 14 interposed therebetween. The sealing layer 14 seals a gap between the first substrate 11 and the second substrate 12 along an entire periphery of a region where the first substrate 11 and the second substrate 12 face each other.

The ellipsoidal reflector 31 is configured so that, for example: it has an internal shape corresponding to a partial surface of a spheroid so as to include one of the two focal points (first focal point) of the spheroid; the inner surface thereof is a mirror surface; and it has a function of focusing light emitted from the phosphor 32 disposed at the first focal point to the other focal point (second focal point). As the ellipsoidal reflector 31, any conventionally known ellipsoidal reflector can be used.

As the phosphor 32, it is possible to use, for example, a phosphor similar to a phosphor that emits light upon excitation with light emitted from, among phosphor-based light emitting diodes (LEDs), a blue LED or an ultraviolet LED. Examples of the phosphor 32 include phosphors that emit lights in a visible light region, such as a red phosphor that emits red light, a green phosphor that emits green light, and a blue phosphor that emits blue light.

The laser 51 is not limited as long as it emits a laser beam in a wavelength range capable of exciting the phosphor 32.

The material of the first substrate 11 is not limited as long as it has a light-transmitting property sufficient to allow light emitted from the organic EL element 13 (to be described below) and the phosphor 32 to be radiated to the outside of the organic EL panel 16. Examples of the material of the first substrate 11 include: glass such as alkali-free glass, soda-lime glass, borosilicate glass, aluminosilicate glass, and quartz glass; and polyester resins such as polyethylene naphthalate and polyethylene terephthalate. Preferably, the first substrate 11 is formed of glass. The size (the length and the width) of the first substrate 11 is not particularly limited, and can be set as appropriate depending on a desired size of the organic EL panel 16, for example. The thickness of the first substrate 11 also is not particularly limited, and can be set as appropriate depending on the material of the first substrate 11, environment in which the first substrate 11 is used, and the like. Generally, the thickness of the first substrate 11 is 1 mm or less.

In the first substrate 11, the position of the light incident portion 15 is not particularly limited. As shown in FIG. 1A, the light incident portion 15 may be at a corner portion on a side surface of the first substrate 11 (the lower right corner portion in FIG. 1A). The light incident portion 15 may have any mechanism as long as it allows light emitted from the phosphor 32 to be incident on the first substrate 11 from the outside of the organic EL panel 16.

As the organic EL element 13, a conventionally known and commonly used organic EL element may be used. The organic EL element 13, which includes an organic EL layer and a pair of electrodes, is a laminate in which an electrode layer as one of the pair of electrodes, the organic EL layer, and another electrode layer as the other one of the pair of electrodes are laminated in this order, for example. The pair of electrodes is the combination of an anode layer and a cathode layer, for example. The anode layer is a transparent electrode formed of indium tin oxide (ITO) or the like, for example. The cathode layer is a counter electrode formed of a metal or the like, for example. The organic EL layer has a multilayer structure including, in sequence, a hole injection layer, a hole transport layer, a light emission layer containing an organic EL material, an electron transport layer, and an electron injection layer, for example. The organic EL panel 16 shown in FIGS. 1A and 1B is of bottom emission type, for example. In the organic EL panel 16 of bottom emission type, it is preferable that, for example, the organic EL element 13 is a laminate in which the transparent electrode (anode), the organic EL layer, and the counter electrode (cathode) are laminated in this order from the first substrate 11 side. Although FIGS. 1A and 1B show an example where one organic EL element 13 is disposed in a central portion on the mounting surface of the first substrate 11, the organic EL panel 16 of the present example embodiment is not limited to this example, and a plurality of (two or more) organic EL elements may be disposed on the mounting surface of the first substrate 11. The emission color of the organic EL element 13 is not particularly limited. For example, when the organic EL panel 16 is used as a general interior lighting device, the emission color of the organic EL element 13 may be white or the like. When the organic EL panel 16 is used as a design-oriented lighting device or an automobile lighting device, the emission color of the organic EL element 13 may be white, red (R), green (G), blue (B), or the like.

The second substrate 12 is a sealing substrate for shielding the organic EL element 13 from the surrounding atmosphere. The second substrate 12 is not limited as long as it can shield the organic EL element 13 from the surrounding atmosphere. For example, sealing glass can be used as the second substrate 12. The size (length and width) of the second substrate 12 is not particularly limited, and may be adjusted as appropriate so as to be substantially the same as or slightly smaller than the size of the first substrate 11, for example. The thickness of the second substrate 12 also is not particularly limited. For example, the thickness of the second substrate 12 is in the range from 0.5 to 1.0 mm.

The sealing layer 14 is formed by, for example, applying an adhesive along the outer edge of one surface of the second substrate 12 (the lower surface in FIG. 1B). The adhesive is not particularly limited. For example, an ultraviolet (UV) curable resin or the like can be used suitably as the adhesive. The sealing layer 14 is formed so as to be slightly thicker than the organic EL element 13. For example, the thickness thereof is in the range from 0.1 to 100 µm.

Next, with reference to FIGS. 2A and 2B, how light travels in the organic EL panel shown in FIGS. 1A and 1B will be described. As described above, the organic EL device 10 of the present example embodiment includes the phosphor 32. The phosphor 32 emits light having a color different from the color of light emitted from the organic EL element 13. The emission color of the phosphor 32 is not particularly limited as long as it is different from the emission color of the organic EL element 13, and may be any color such as red (R), green (G), or blue (B), for example.

Figure 2A:
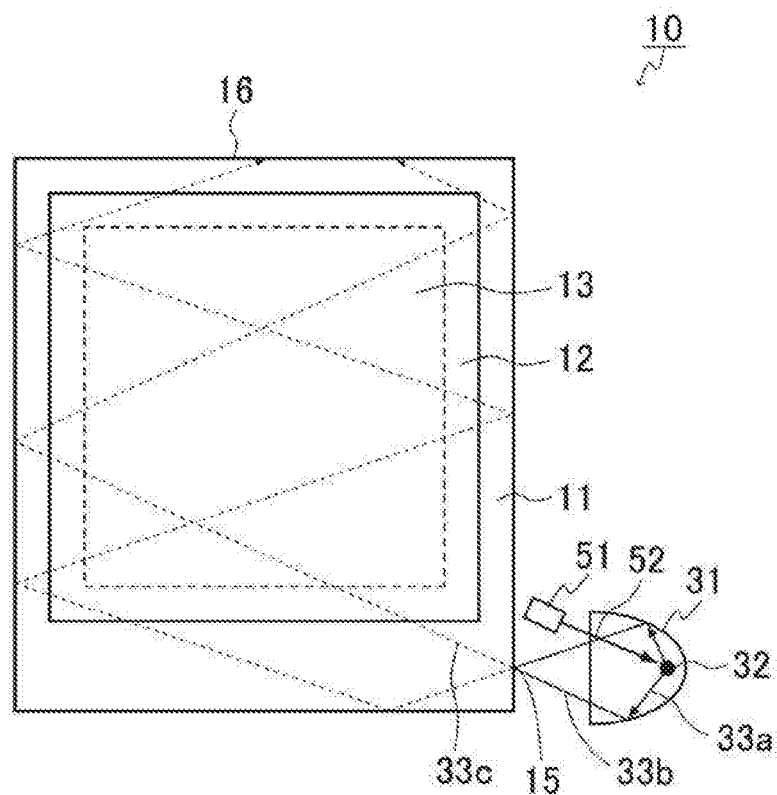
FIGS. 2A and 2B illustrate how light travels in the organic EL device shown in FIGS. 1A and 1B.
Figure 2B:
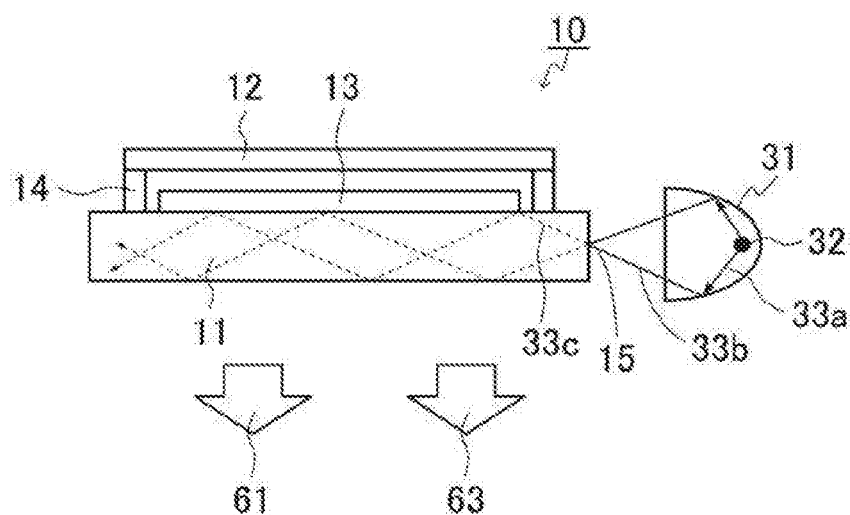

As indicated with a solid-line arrow 52 in FIG. 2A, a laser beam emitted from the laser 51 travels in the air toward the phosphor 32. The phosphor 32 is excited by the laser beam, whereby it emits light. As indicated with a solid-line arrow 33a in FIGS. 2A and 2B, the light emitted from the phosphor 32 travels in the ellipsoidal reflector 31 and is reflected from the inner surface of the ellipsoidal reflector 31. Then, as indicated with a solid-line arrow 33b in FIGS. 2A and 2B, the light from the phosphor 32 that has been reflected travels in the air toward the light incident portion 15. As indicated with a dashed-line arrow 33c in FIG. 2B, in the thickness direction of the first substrate 11, the light from the phosphor 32 that has reached the light incident portion 15 travels inside the first substrate 11 while being reflected repeatedly from the lower surface and the upper surface of the first substrate 11. In the in-plane direction of the first substrate 11, as indicated with a dashed-line arrow 33c in FIG. 2A, it diffuses throughout the entire surface while being reflected repeatedly from the respective side surfaces of the first substrate 11. While the dashed-line arrow 33c in FIG. 2A extends up to the upper side surface of the first substrate 11, the light from the phosphor 32 actually is reflected further from the upper side surface of the first substrate 11, and thereafter, the light diffuses throughout the entire surface while being reflected repeatedly from the respective side surfaces of the first substrate 11. As indicated with a thick arrow 61 in FIG. 2B, the light from the phosphor 32 that has diffused throughout the entire surface is radiated in the air outside the organic EL panel 16 from the other surface of the first substrate 11 (the lower surface in FIG. 2B). At this time, emitted light 63 from the organic EL element 13 is mixed with the emitted light 61, whereby color tuning is achieved.

According to the organic EL device 10 of the present example embodiment, it becomes possible for a user to adjust the emission color (to perform color tuning) of the organic EL panel 16 by selecting the phosphor 32 with emission color necessary for the color tuning, for example. Furthermore, according to the organic EL panel 16 in the organic EL device 10 of the present example embodiment, the aperture ratio is not restricted, so that a larger amount of luminous flux is emitted from the light emission surface (the lower surface of the first substrate 11 in FIG. 2B), as compared with an organic EL panel with the above-described RGB separation structure.

Further, according to the organic EL device 10 of the present example embodiment in which the ellipsoidal reflector 31 is disposed outside the organic EL panel 16 in such a manner that the phosphor 32 is disposed at the first focal point of the ellipsoidal reflector and the light incident portion 15 of the substrate 11 is positioned at the second focal point of the ellipsoidal reflector, it is possible to focus light emitted from the phosphor 32 on the light incident portion 15 efficiently.

Still further, according to the organic EL device 10 of the present example embodiment, instead of causing the sharp laser beam 52 with a narrow wavelength band to be incident on the light incident portion 15 directly, light emitted from the phosphor 32 with a broad wavelength band is caused to be incident on the light incident portion 15. This allows a larger energy of light to be utilized.

The organic EL device 10 of the present example embodiment can be used in a wide range of applications, such as a lighting device of bottom emission type, a light source, and a display device, for example.

Second Example Embodiment

Figure 3:
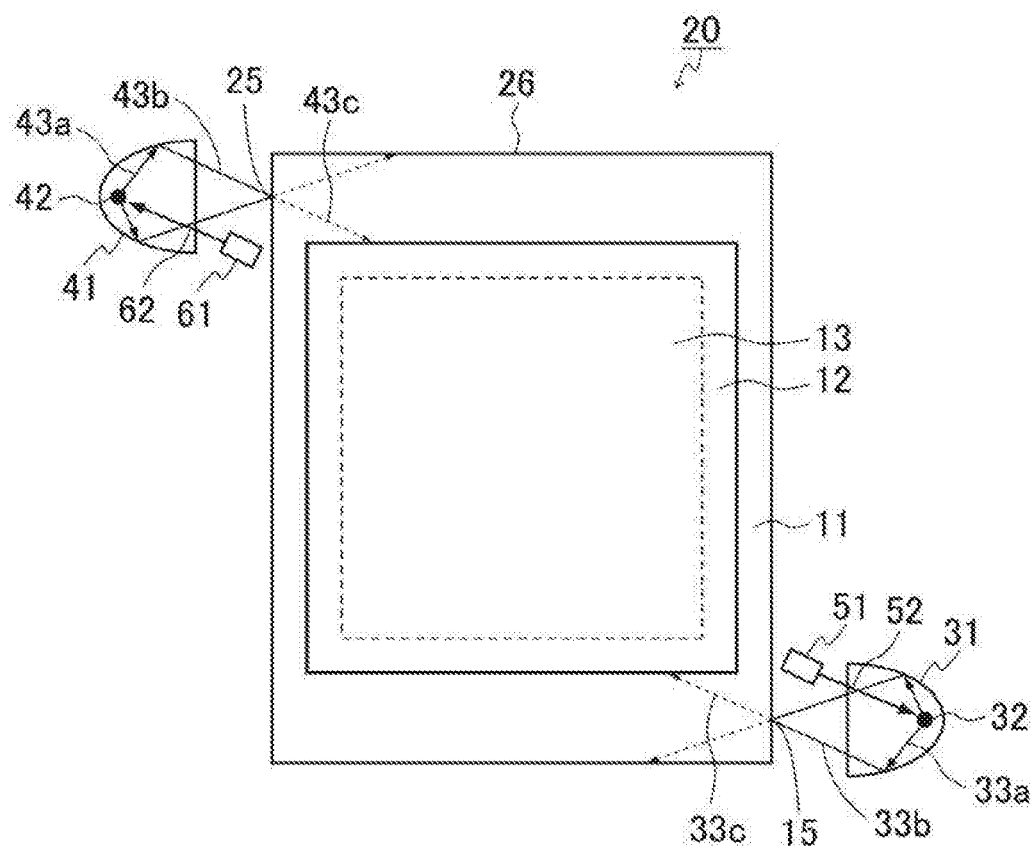
FIG. 3 is a plan view showing an example of the configuration of an organic EL device according to a second example embodiment.

The present example embodiment is directed to an example of an organic EL device configured so that a first substrate includes two light incident portions. FIG. 3 is a plan view showing an example of the configuration of an organic EL device of the present example embodiment. As shown in FIG. 3, an organic EL device 20 of the present example embodiment has the same configuration as the organic EL device 10 of the first example embodiment, except that the first substrate 11 further includes a second light incident portion 25 and that the organic EL device 20 includes, in addition to the laser 51, the ellipsoidal reflector 31, and the phosphor 32, a second laser 81, a second ellipsoidal reflector 41, and a second phosphor 42 disposed near the second light incident portion 25. The second light incident portion 25 has the same shape and mechanism as the light incident portion 15. The second light incident portion 25 is disposed at a corner portion facing the light incident portion 15. It is to be noted, however, that the organic EL device 20 of the present example embodiment is not limited to this example, and the second light incident portion 25 may be disposed at a different corner portion on a side surface of the first substrate 11, for example. The second phosphor 42 has the same configuration as the phosphor 32, except that it emits light having a color different from the colors of lights emitted from the organic EL element 13 and the phosphor 32 or it emits light having a color same as the color of light emitted from either the organic EL element 13 or the phosphor 32.

As indicated with a solid-line arrow 82 in FIG. 3, a laser beam emitted from the second laser 81 travels in the air toward the second phosphor 42. The second phosphor 42 is excited by the laser beam, whereby it emits light. As indicated with a solid-line arrow 43a in FIG. 3, the light emitted from the second phosphor 42 travels in the ellipsoidal reflector 41 and is reflected from the inner surface of the ellipsoidal reflector 41. Then, as indicated with a solid-line arrow 43b in FIG. 3, the light from the second phosphor 42 that has been reflected travels in the air toward the second light incident portion 25. In the in-plane direction of the first substrate 11, the light from the second phosphor 42 that has reached the second light incident portion 25 diffuses throughout the entire surface while being reflected repeatedly from the respective side surfaces of the first substrate 11 in the same manner as indicated with the dashed-line arrow 33c in FIG. 2A. The light from the second phosphor 42 that has diffused throughout the entire surface is radiated in the air outside the organic EL panel 26 from the other surface of the first substrate 11. Thus, according to the organic EL device 20 of the present example embodiment, when the emission color of the second phosphor 42 is different from those of the organic EL element 13 and the phosphor 32, it is possible to mix three emission colors, namely, the emission color of the organic EL element 13, the emission color of the phosphor 32, and the emission color of the second phosphor 42. On the other hand, when the emission color of the second phosphor 42 is the same as that of either the organic EL element 13 or the phosphor 32, it is possible to mix two emission colors at a ratio different from that in the first example embodiment.

When the organic EL panel in the organic EL device of the present invention is formed in, for example, a substantially hexagonal shape or a substantially octagonal shape, it becomes possible to mix three or more colors with the emission color of the organic EL element by providing three or more light incident portions in the first substrate and using three or more lasers and phosphors.

Third Example Embodiment

Figure 4:
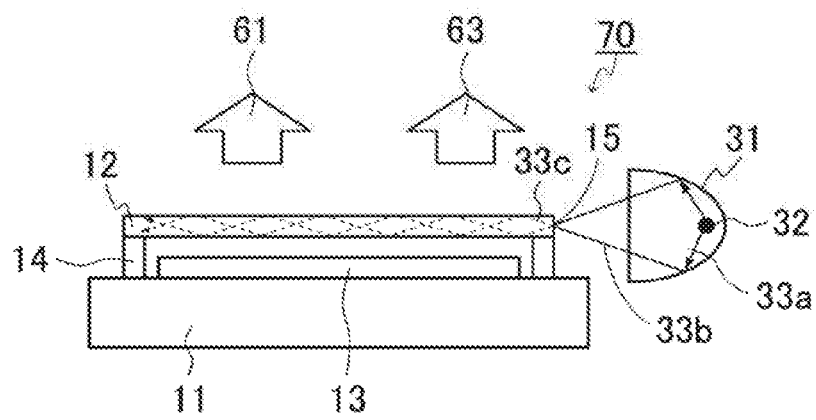
FIG. 4 is a side view showing an example of the configuration of an organic EL device according to a third example embodiment.

The present example embodiment is directed to an example of an organic EL device configured so that a second substrate includes one light incident portion. FIG. 4 shows an example of the configuration of an organic EL device of the present example embodiment. FIG. 4 is a side view of an organic EL device 70 of the present example embodiment. As shown in FIG. 4, an organic EL panel in the organic EL device 70 of the present example embodiment has the same configuration as the organic EL panel 16 in the organic EL device 10 of the first example embodiment, except that, instead of a first substrate 11, a second substrate 12 includes a light incident portion 15. The organic EL panel shown in FIG. 4 is of top emission type, for example. In the organic EL panel of top emission type, it is preferable that, for example, an organic EL element 13 is a laminate in which the counter electrode (cathode), the organic EL layer, and the transparent electrode (anode) are laminated in this order from the first substrate 11 side. According to the organic EL device 70 of the present example embodiment, emitted light 61 from a phosphor 32 and emitted light 63 from the organic EL element 13 can be radiated from the upper side of the organic EL panel. The organic EL device 70 of the present example embodiment can be used in a wide range of applications, such as a lighting device of top emission type, a light source, and a display device, for example.

Also in the organic EL device 70 of the present example embodiment, it is possible to mix two or more colors with the emission color of the organic EL element by providing two or more light incident portions in the second substrate in the same manner as they are provided on the first substrate in the second example embodiment and using two or more lasers and phosphors.

The first to third example embodiments are directed to illustrative examples where the organic EL device is configured so that either the first substrate or the second substrate has the light incident portion(s). It should be noted, however, that the organic EL device of the present invention may be configured so that both the first substrate and the second substrate has the light incident portion(s).

While the present invention has been particularly shown and described with reference to example embodiments, the present invention is not limited to these embodiments. Various changes and modifications that may become apparent to those skilled in the art may be made in the configuration and specifics of the present invention without departing from the scope of the present invention.

This application claims priority from Japanese Patent Application No. 2016-096433 filed on May 12, 2016. The entire disclosure of this Japanese patent application is incorporated herein by reference.

INDUSTRIAL APPLICABILITY

The present invention can provide a novel organic EL device including an organic EL panel adapted to be color tunable by a user, for example. The organic EL device of the present invention can be used in a wide range of applications, such as a lighting device of bottom emission type, top emission type, or the like, a light source, and a display device, for example.

REFERENCE SIGNS LIST 10, 20, 70: organic EL device
11: first substrate
12: second substrate
13: organic EL element
14: sealing layer
15, 25: light incident portion
16, 26: organic EL panel
31, 41: ellipsoidal reflector
32, 42: phosphor
51, 81: laser

What is claimed is:
1. An organic EL device comprising:
an organic EL panel;
an ellipsoidal reflector;
a phosphor; and
a laser,
the organic EL panel comprising:
    a substrate, and
    at least one organic EL element,
wherein the substrate comprises at least one light incident portion on which light is incident from an outside,
the ellipsoidal reflector is disposed outside the organic EL panel in such a manner that the phosphor is disposed at a first focal point of the ellipsoidal reflector and the light incident portion of the substrate is positioned at a second focal point of the ellipsoidal reflector,
the laser is disposed outside the organic EL panel in such a manner that the phosphor can be irradiated with a laser beam,
light emitted from the phosphor enters the substrate from the light incident portion, and
the light emitted from the phosphor that has entered the substrate diffuses in an in-plane direction of the substrate.
2. The organic EL device according to claim 1, wherein the organic EL panel comprises a first substrate, a second substrate, a sealing layer, and the at least one organic EL element, and
one surface of the first substrate is a mounting surface on which the at least one organic EL element is disposed,
the first substrate and the second substrate are laminated in such a manner that the mounting surface of the first substrate and one surface of the second substrate face each other with the sealing layer interposed therebetween,
the sealing layer seals a gap between the first substrate and the second substrate along an entire periphery of a region where the first substrate and the second substrate face each other, and
at least one of the first substrate and the second substrate has the light incident portion.
3. The organic EL device according to claim 2, wherein at least one of the first substrate and the second substrate has the light incident portion at a corner portion on a side surface thereof.

4. The organic EL device according to claim 2, wherein
the organic EL element comprises an organic EL layer and a pair of electrodes,
the organic EL element is a laminate in which an electrode layer as one of the pair of electrodes, the organic EL layer, and another electrode layer as the other one of the pair of electrodes are laminated in this order and the electrode layer on the first substrate side is a transparent electrode, and
the first substrate has the light incident portion.

5. The organic EL device according to claim 2, wherein
the organic EL element comprises an organic EL layer and a pair of electrodes,
the organic EL element is a laminate in which an electrode layer as one of the pair of electrodes, the organic EL layer, and another electrode layer as the other one of the pair of electrodes are laminated in this order and the electrode layer on the second substrate side is a transparent electrode, and
the second substrate has the light incident portion.

6. The organic EL device according to claim 2, wherein
two or more light incident portions are provided, and
the light incident portions are provided at different corner portions of at least one of the first substrate and the second substrate, respectively.

7. The organic EL device according to claim 2, wherein
at least one of the first substrate and the second substrate is a glass substrate.

8. The organic EL device according to claim 1, wherein
the organic EL element comprises an organic EL layer and a pair of electrodes.

* * * * *